(12) United States Patent
Lim et al.

(10) Patent No.: US 9,778,528 B2
(45) Date of Patent: Oct. 3, 2017

(54) DISPLAY APPARATUS

(71) Applicant: Samsung Display Co., Ltd., Yongin, Gyeonggi-Do (KR)

(72) Inventors: Sang-Uk Lim, Yongin-si (KR); Sunhwa Lee, Hwaseong-si (KR); Ji-Sun Kim, Seoul (KR); Kwang-chul Jung, Seongnam-si (KR); Seokha Hong, Yongin-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/640,954

(22) Filed: Mar. 6, 2015

(65) Prior Publication Data

US 2016/0062201 A1 Mar. 3, 2016

(30) Foreign Application Priority Data

Aug. 26, 2014 (KR) ........................ 10-2014-0111722

(51) Int. Cl.
| | |
|---|---|
| *H01L 27/12* | (2006.01) |
| *G02F 1/1362* | (2006.01) |
| *G02F 1/1343* | (2006.01) |
| *G09G 3/36* | (2006.01) |

(52) U.S. Cl.
CPC .. *G02F 1/136286* (2013.01); *G02F 1/134336* (2013.01); *G09G 3/3611* (2013.01); *G09G 3/3614* (2013.01); *H01L 27/124* (2013.01); *G09G 2300/0426* (2013.01); *G09G 2300/0452* (2013.01); *G09G 2310/067* (2013.01); *G09G 2320/0209* (2013.01)

(58) Field of Classification Search
CPC .................................................... G09G 3/3696
See application file for complete search history.

(56) References Cited

U.S. PATENT DOCUMENTS

| | | | |
|---|---|---|---|
| 8,587,504 B2 | 11/2013 | Joo | |
| 2007/0030230 A1* | 2/2007 | Lee | ...................... G09G 3/3648 345/94 |
| 2008/0266225 A1 | 10/2008 | Kim | |
| 2012/0120035 A1 | 5/2012 | Yang et al. | |
| 2012/0320026 A1 | 12/2012 | Kitayama et al. | |
| 2013/0050282 A1 | 2/2013 | Kim | |
| 2013/0076714 A1* | 3/2013 | Lim | ...................... G09G 3/003 345/208 |
| 2013/0093739 A1 | 4/2013 | Kim et al. | |

(Continued)

FOREIGN PATENT DOCUMENTS

| | | |
|---|---|---|
| EP | 2549466 A1 | 1/2013 |
| KR | 1020070028744 A | 3/2007 |
| KR | 1020080050853 A | 6/2008 |

(Continued)

*Primary Examiner* — Fernando L Toledo
*Assistant Examiner* — Valerie N Newton
(74) *Attorney, Agent, or Firm* — Innovation Counsel LLP

(57) ABSTRACT

A display apparatus includes gate lines configured to receive gate signals, data lines arranged to cross the gate lines and configured to receive data voltages, and pixels grouped into first pixel groups and second pixel groups and connected to the gate lines and the data lines. The gate signals are configured to be applied to the gate lines in a predetermined order while skipping at least one gate line without being sequentially and consecutively applied to two gate lines adjacent to each other among the gate lines.

20 Claims, 11 Drawing Sheets

(56) References Cited

U.S. PATENT DOCUMENTS

2014/0232624 A1   8/2014  Kim et al.
2014/0362073 A1*  12/2014 Huang ................. G09G 3/3674
                                                345/213

FOREIGN PATENT DOCUMENTS

| KR | 1020110077899 A | 7/2011  |
|----|-----------------|---------|
| KR | 1020130000997 A | 1/2013  |
| KR | 1020140006490 A | 1/2014  |
| KR | 1020150139132   | 12/2015 |

* cited by examiner

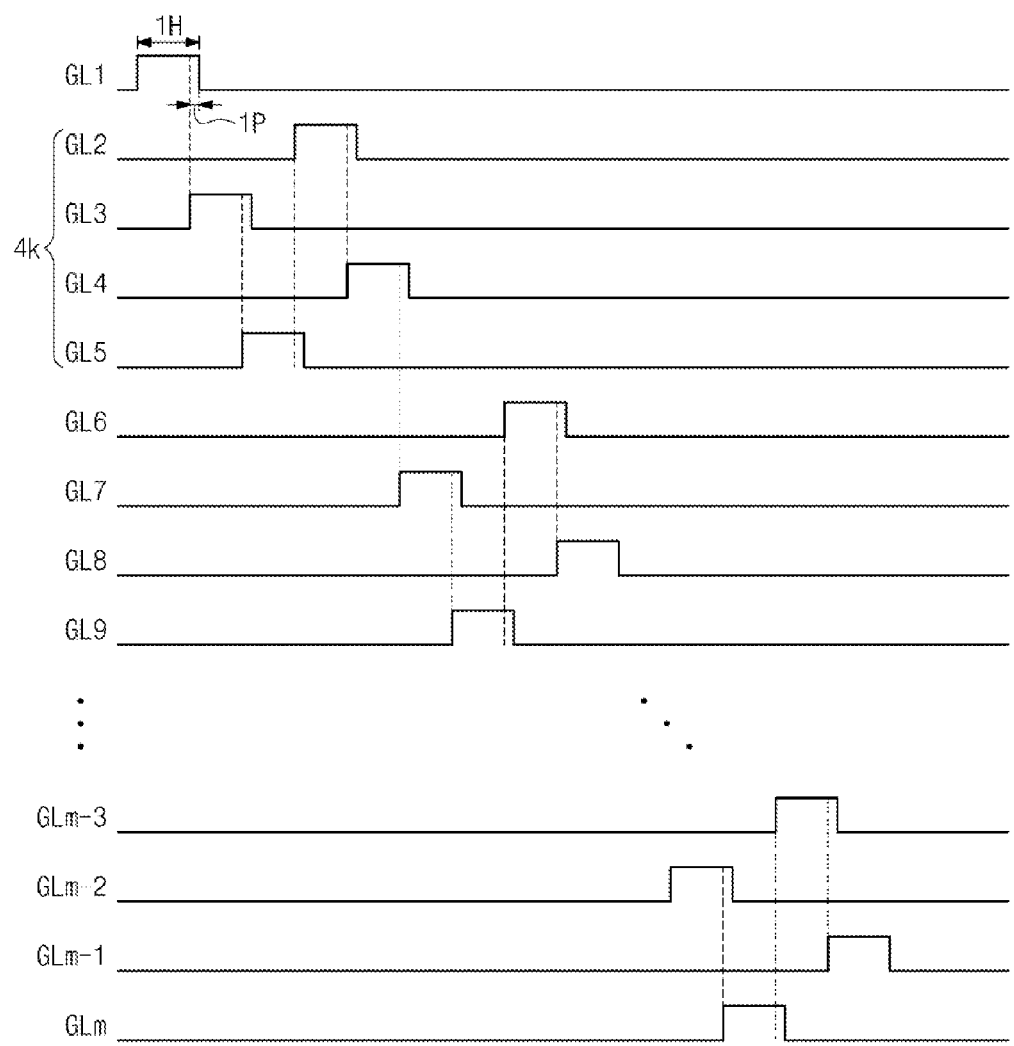

DISPLAY APPARATUS

CROSS-REFERENCE TO RELATED APPLICATION

This U.S. non-provisional patent application claims priority under 35 U.S.C. §119 of Korean Patent Application No. 10-2014-0111722, filed on Aug. 26, 2014, the contents of which are hereby incorporated by reference in its entirety.

BACKGROUND

1. Field of Disclosure

The present disclosure relates to a display apparatus. More particularly, the present disclosure relates to a display apparatus capable of improving display quality.

2. Description of the Related Art

A display apparatus displays colors using wavelengths of three primary colors, e.g., red, green, and blue colors. A display panel applied to the display apparatus includes pixels respectively corresponding to the red, green, and blue colors.

In recent years, a display apparatus that displays the colors using another primary color in addition to the red, green, and blue colors has been developed. The primary color is one or more colors of magenta, cyan, yellow, and white colors. To improve brightness of an image, a display apparatus that includes red, green, blue, and white pixels has been developed. The display apparatus receives red, green, and blue image signals and converts the red, green, and blue image signals to red, green, blue, and white data signals.

The converted red, green, blue, and white data signals are respectively applied to corresponding red, green, blue, and white pixels. As a result, the image is displayed by the red, green, blue, and white pixels.

SUMMARY

The present disclosure provides a display apparatus capable of improving display quality.

Embodiments of the inventive concept provide a display apparatus including a plurality of gate lines configured to receive gate signals, a plurality of data lines arranged to cross the gate lines and configured to receive data voltages, and a plurality of pixels grouped into a plurality of first pixel groups and a plurality of second pixel groups and connected to the gate lines and the data lines. The gate signals are configured to be applied to the gate lines in a predetermined order while skipping at least one gate line without being sequentially and consecutively applied to two gate lines adjacent to each other among the gate lines.

The pixels arranged in a c-th column between a j-th data line and a (j+1)th data line among the data lines are alternately connected to the j-th data line and the (H)th data line, and each of j and c is a natural number.

Among the pixels arranged in a (2c−1)th column, two pixels adjacent to each other in a column direction such that a 2i-th gate line is disposed between the two pixels are commonly connected to the 2i-th gate line, and among the pixels arranged in a 2c-th column, two pixels adjacent to each other in the column direction such that a (2i−1)th gate line is disposed between the two pixels are commonly connected to the (2i−1)th gate line, and the i is a natural number.

Each of the pixels is configured to display one color of red, green, blue, white, yellow, cyan, and magenta colors.

The first pixel groups are alternately arranged with the second pixel groups in row and column directions and are configured to display colors different from colors configured to be displayed by the second pixel groups.

Each of the first and second pixel groups includes 2h pixels and the h is a natural number.

Each of the first pixel groups includes two pixels of red, green, blue, and white pixels and each of the second pixel groups includes the other two pixels of the red, green, blue, and white pixels.

Each of the first pixel groups includes the red pixel configured to display a red color and the green pixel configured to display a green color.

Each of the second pixel groups includes the blue pixel configured to display a blue color and the white pixel configured to display a white color.

A polarity of the data voltages configured to be applied to the data lines is inverted every one data line and inverted every frame period.

The gate signals are configured to be sequentially applied to the gate lines in the unit of 4k gate lines after a first gate line of the gate lines is applied with a corresponding gate, signal of the gate signals, and the k is a natural number.

The gate signals are configured to be applied to the 4k gate lines in a predetermined order while skipping at least one gate line in the 4k gate lines.

The gate signals are configured to be applied to the four gate lines in order of second, fourth, first, and third gate lines of the four gate lines after the corresponding gate signal is applied to the first gate line.

A predetermined portion of an end portion of an activation period of a present gate signal is overlapped with a predetermined portion of a start portion of an activation period of a next gate signal following the present gate signal.

According to the above, the display apparatus may improve the display quality.

BRIEF DESCRIPTION OF THE DRAWINGS

The above and other advantages of the present disclosure will become readily apparent by reference to the following detailed description when considered in conjunction with the accompanying drawings wherein:

FIG. 5 is a timing diagram of gate signals according to an exemplary embodiment of the present disclosure;

DETAILED DESCRIPTION

Figure 1:
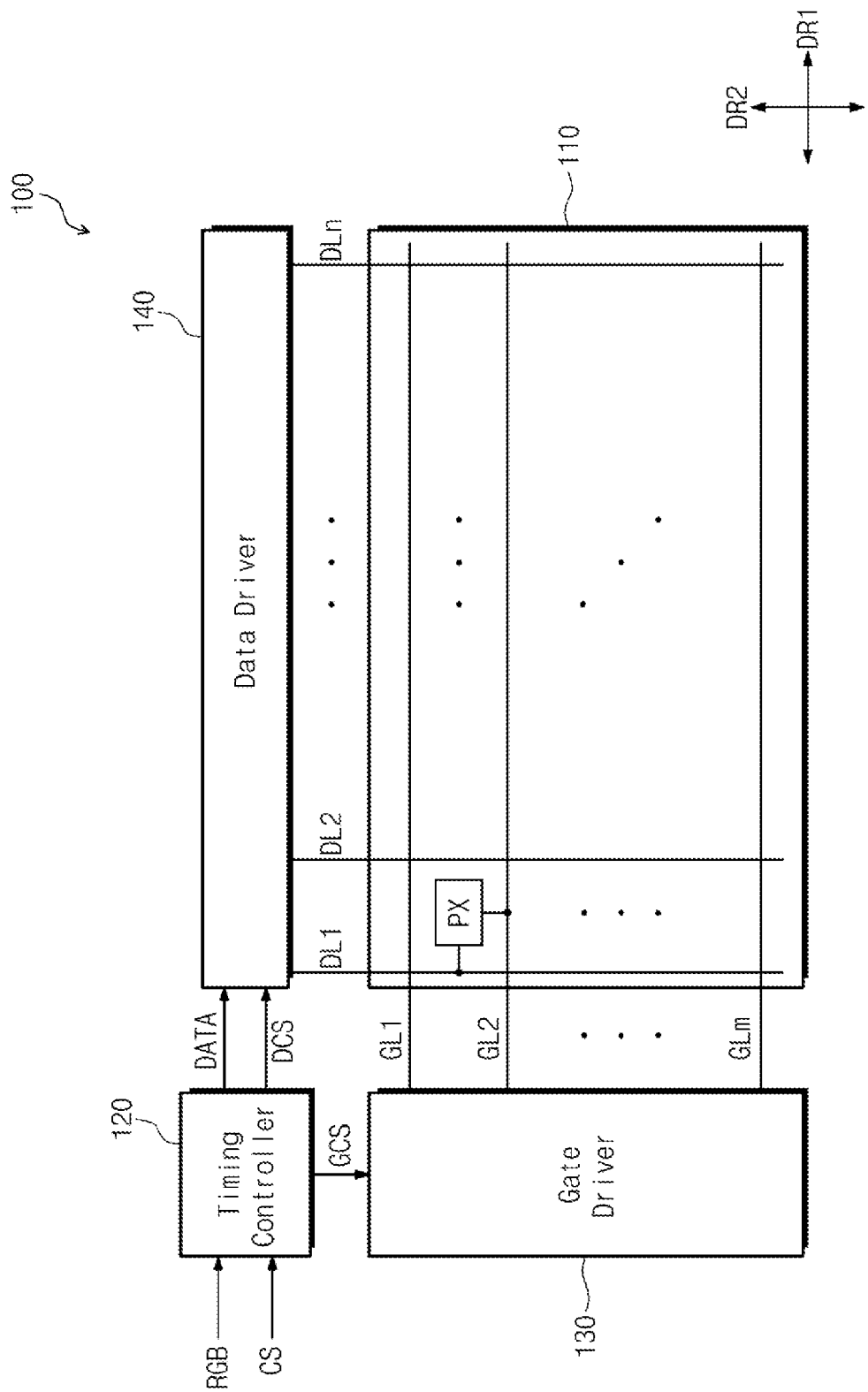
FIG. 1 is a block diagram showing a display apparatus according to an exemplary embodiment of the present disclosure.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, t may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below" "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1 is a block diagram showing a display apparatus 100 according to an exemplary embodiment of the present disclosure.

Referring to FIG. 1, the display apparatus 100 includes a display panel 110, a timing, controller 120, a gate driver 130, and a data driver 140.

The display panel 110 may be, but not limited to, a liquid crystal display panel configured to include two substrates facing each other and a liquid crystal layer interposed between the two substrates. The display panel 110 includes a plurality of gate lines GL1 to GLm, a plurality of data lines DL1 to DLn, and a plurality of pixels PX.

The gate lines GL1 to GLm extend in a first direction DR1 and is connected to the gate driver 130. The data lines DL1 to DLn extend in a second direction DR2 crossing the first direction DR1 and is connected to the data driver 140. Each of "m" and "n" is a natural number. The first direction DR1 corresponds to a row direction and the second direction DR2 corresponds to a column direction.

The pixels PX are arranged in regions defined in association with the gate lines GL1 to GLm and the data lines DL1 to DLn crossing the gate lines GL1 to GLm. Accordingly, the pixels PX are arranged in a matrix form.

Each pixel PX is connected to a corresponding gate line of the gate lines GL1 to GLm and a corresponding data line of the data lines DL1 to DLm. Connections between the pixels PX and the gate lines GL1 to GLm and between the pixels PX and the data lines DL1 to DLn will be described in detail with reference to FIG. 3.

Each pixel PX displays one of primary colors. The primary colors include red, green, blue, and white colors, but they should not be limited thereto or thereby. The primary colors may further include various colors, e.g., cyan, magenta, yellow, etc.

The timing controller 120 receives image signals RGB and control signals. CS from an external system board (not shown). The control signals CS includes a vertical synchronization signal as a frame distinction signal, a horizontal synchronization signal as a row distinction signal, a data enable signal maintained at a high level during a period, in which data are output, to indicate a data input period.

The timing controller 120 converts a data format of the image signals RGB to a data format appropriate to an interface between the timing controller 120 and the data driver 140. The timing controller 120 applies output data DATA having the converted data format to the data driver 140.

The timing controller 120 generates a gate control signal GCS and a data control signal DCS in response to the control signals CS. The gate control signal GCS is used to control an operation timing of the gate driver 130 and the data control signal DCS is used to control an operation timing of the data driver 140.

The gate control signal GCS includes a scan start signal indicating a start of scanning, at least one clock signal controlling an output period of a gate on voltage, and an output enable signal controlling the maintaining of the gate on voltage.

The data control signal DCS includes a horizontal start signal indicating a start of transmitting of the image data DATA to the data driver 140, a load signal indicating application of data voltages to the data lines DL1 to DLn, and a polarity control signal determining a polarity of the data voltages with respect to a common voltage.

The timing controller 120 applies the gate control signal GCS to the gate driver 130 and applies the data control signal DCS to the data driver 140.

The gate driver 130 generates gate signals in response to the gate control signal GCS. The gate signals are applied to the pixels PX through the gate lines GL1 to GLm in the unit of row. The gate signals are output such that the gate signals are not sequentially and consecutively applied to the pixels PX through two gate lines adjacent to each other. The timings of the gate signals will be described in detail later with reference to FIGS. 5 and 7 to 10.

The data driver 140 generates the data voltages in analog form, which correspond to the image data DATA, in response to the data control signal DCS. The data voltages are applied to the pixels PX through the data lines DL1 to DLn.

The polarity of the data voltages applied to the pixels PX is inverted every frame period to prevent liquid crystals from burning or deteriorating. For instance, the data driver 140 inverts the polarity of the data voltages every frame period in response to the polarity control signal. In addition, when the image corresponding to one frame is displayed, the data voltages having different polarities are output in the unit of one data line, and then alternately applied to the pixels PX.

The pixels PX receive the data voltages through the data lines DL1 to DLn in response to the gate signals applied thereto through the gate lines GL1 to GLm. The pixels. PX displays gray scales corresponding to data voltages, and thus the image is displayed.

The timing controller 120 is mounted on a printed circuit board in an integrated circuit chip and connected to the gate driver 130 and the data driver 140. The gate driver 130 and the data driver 140 are integrated into plural driving chips, mounted on flexible printed circuit board, and connected to the display panel 110 in a tape carrier package method, but they should not be limited thereto or thereby.

As another way, the gate driver 130 and the data driver 140 may be mounted on the display panel 110 in a chip-on-glass method after being integrated into plural driving chips. The gate driver 130 may be substantially simultaneously formed with transistors of the pixels PX, and then mounted on the display panel 110 in an amorphous silicon TFT gate driver circuit (ASG) method.

Figure 2:
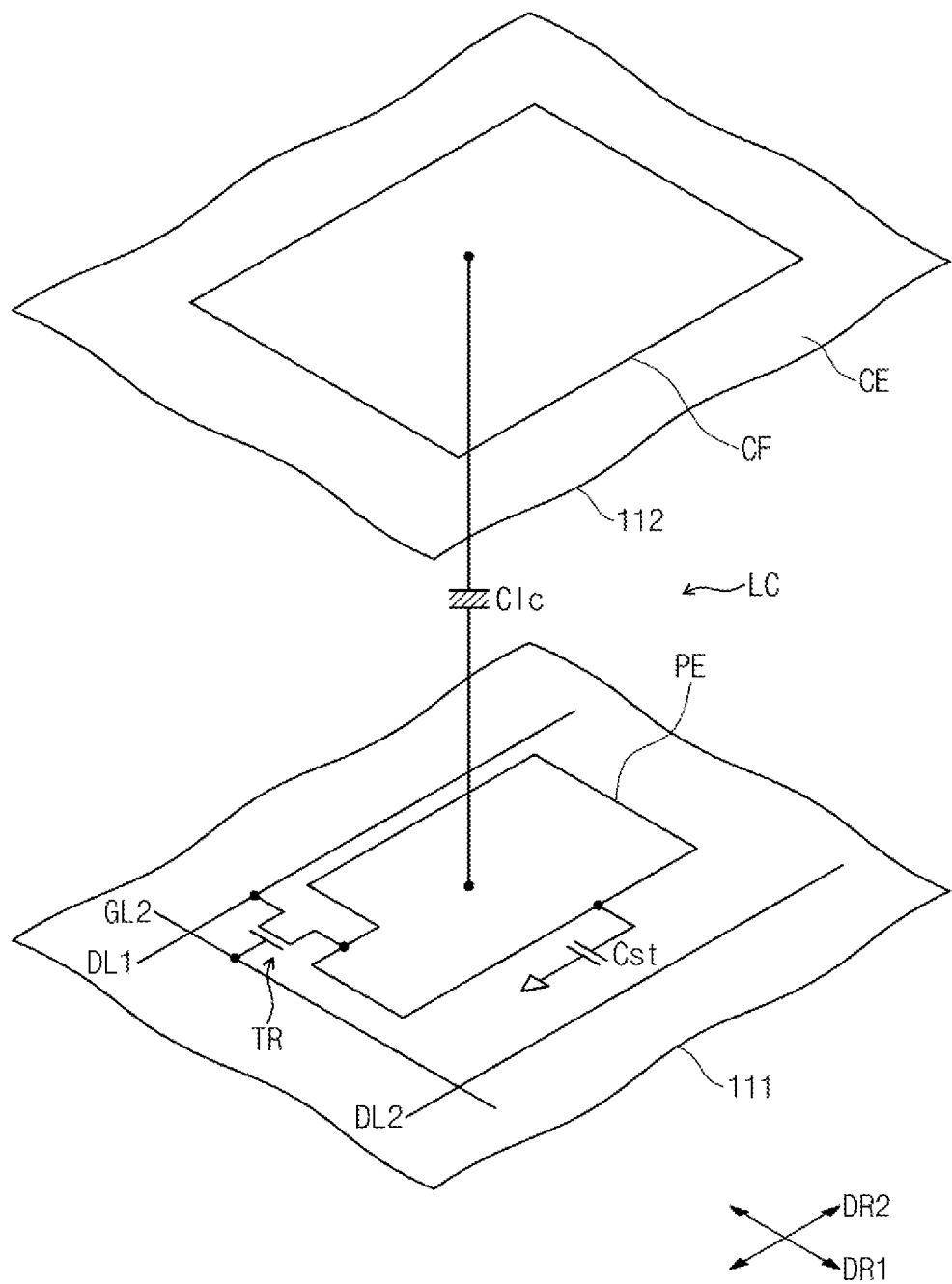
FIG. 2 is an equivalent circuit diagram showing one pixel shown in FIG. 1.

FIG. 2 is an equivalent circuit diagram showing one pixel PX shown in FIG. 1.

In the present exemplary embodiment, the pixels PX have the same structure and function, and thus, for the convenience of explanation. FIG. 2 shows only the pixel PX connected to a second gate line GL2 and a first data line DL1.

Referring to FIG. 2, the display panel 110 includes a first substrate 111, a second substrate 112 facing the first substrate 111 and a liquid crystal layer LC interposed between the first substrate ill and the second substrate 112.

The pixel PX includes a transistor TR connected to the second gate line GL2 and the first data line DT1, a liquid crystal capacitor Clc connected to the transistor TR, and a storage capacitor Cst connected to the liquid crystal capacitor Clc in parallel. The storage capacitor Cst may be omitted.

The transistor TR is disposed on the first substrate 111. The transistor TR includes a gate electrode connected to the second gate line GL2, a source electrode connected to the first data line DL1, and a drain electrode connected to the liquid crystal capacitor Clc and the storage capacitor Cst.

The liquid crystal capacitor Clc is configured to include a pixel electrode PE disposed on the first substrate 111, a common electrode CE disposed on the second substrate 112, and the liquid crystal layer LC interposed between the pixel electrode PE and the common electrode CE. The liquid crystal layer LC serves as a dielectric substance. The pixel electrode PE is connected to the drain electrode of the transistor TR.

The pixel electrode PE shown in FIG. 2 does not have a slit structure, but the pixel PX may have the slit structure in which a trunk portion having a cross shape and a plurality of branch portions extending from the trunk portion in a radial shape are formed through the pixel PX.

The common electrode CE is disposed over the second substrate 112, but it should not be limited thereto or thereby. That is, the common electrode CE may be disposed on the first substrate 111 according to embodiments. In this case, at least one of the pixel electrode PE and the common electrode CE may have the slit structure.

The storage capacitor Cst is configured to include the pixel electrode PE, a storage electrode (not shown) branched from a storage line (not shown), and an insulating layer disposed between the pixel electrode PE and the storage electrode. The storage line is disposed on the first substrate 111. The storage line is disposed on the same layer as the gate lines GL1 to GLm and substantially simultaneously formed with the gate lines GL1 to GLn.

The pixel PX may further include a color filter CF that represents one of the primary colors. The color filter CF is disposed on the second substrate 112 as shown in FIG. 2, but it should not be limited thereto or thereby. That is, the color filter CF may be disposed on the first substrate 111 instead of the second substrate 112.

The transistor TR is turned on in response to the gate signal applied thereto through the second gate line GL2. The data voltage provided through the first data line DL1 is applied to the pixel electrode PE of the liquid crystal capacitor Clc through the turned-on transistor TR. The common electrode CE is applied with the common voltage.

Due to a difference in voltage level between the data voltage and the common voltage, an electric field is generated between the pixel electrode PE and the common electrode CE. Liquid crystal molecules of the liquid crystal layer LC are driven by the electric field generated between the pixel electrode PE and the common electrode CE. A transmittance of light incident to the liquid crystal layer LC is controlled by the liquid crystal molecules driven by the electric field, and thus the image is displayed.

Although not shown in figures, a backlight unit may be disposed at a rear side of the display panel 110 to provide the display panel 110 with the light.

The storage line is applied with a storage voltage having a constant voltage level, but it should not be limited thereto or thereby. That is, the storage line may be applied with the common voltage. The storage capacitor Cst compensates for the lack of the charging rate of the liquid crystal capacitor Clc.

Figure 3:
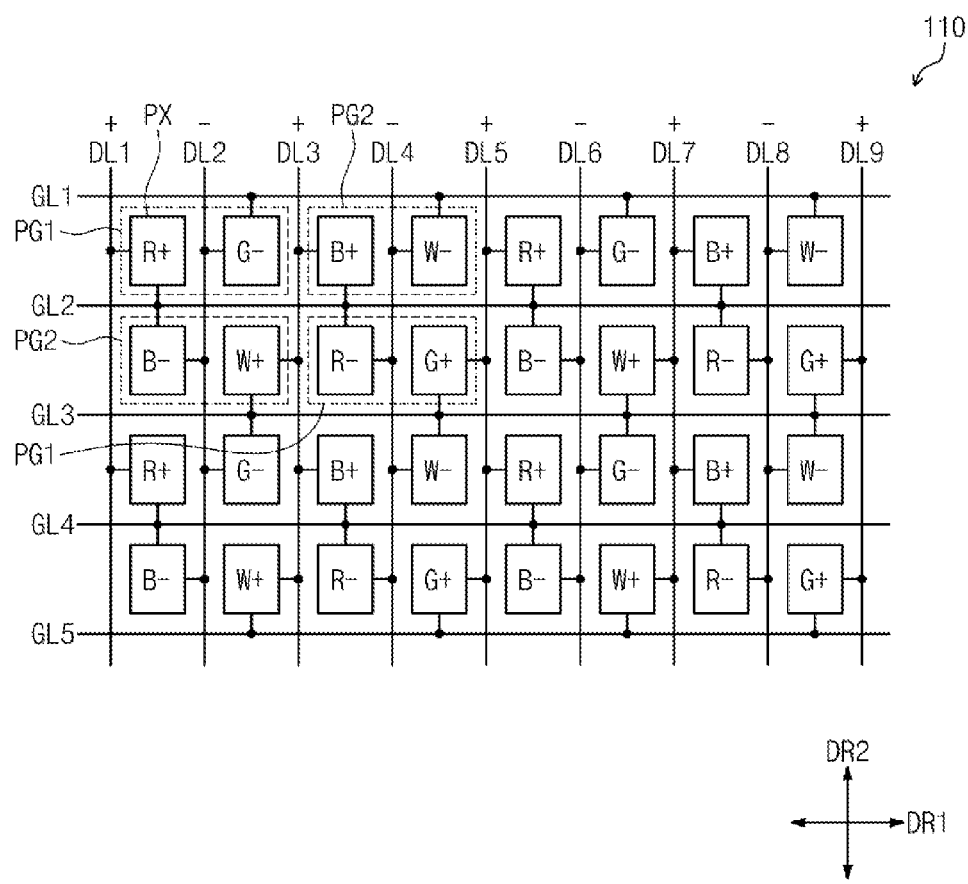
FIG. 3 is a plan view showing a part of a display panel according to an exemplary embodiment of the present disclosure.

FIG. 3 is a plan view showing a part of a display panel according to an exemplary embodiment of the present disclosure.

FIG. 3 shows the pixels PX connected to first to fifth gate lines GL1 to GL5 and first to ninth data lines DL1 to DL9. For the convenience of explanation, red, green, blue, and white pixels are indicated by "R", "G", "B", and "W", respectively, in FIG. 3.

In FIG. 3, the pixels PX applied with the data voltages having a positive (+) polarity during a present frame period are represented by "R+", "G+", "B+", and "W+", respectively, and the pixels PX applied with the data voltages having a negative (−) polarity during the present frame period are represented by "R−", "G−", "B−", and "W−", respectively.

Referring to FIG. 3, the pixels PX are configured to include the red pixels R displaying the red color, the green pixels G displaying the green color, the blue pixels B displaying the blue color, and the white pixels W displaying the white color, but they should not be limited thereto or thereby. The pixels PX may further include yellow, cyan, and magenta pixels respectively displaying the yellow, cyan, and magenta colors.

The pixels PX are grouped into first pixel groups PG1 and second pixel groups PG2. The first pixel groups PG1 are alternately arranged with the second pixel groups PG2 in the first and second directions DR1 and DR2.

Each of the first and second pixel groups PG1 and PG2 includes 2h pixels PX. The "h" is a natural number. In the present exemplary embodiment, the "h" is 1. Therefore, each of the first and second pixel groups PG1 and PG2 includes two pixels PX as shown in FIG. 3.

Each of the first pixel groups PG1 includes two pixels of the red, green, blue, and white pixels R, G, B, and W and each of the second pixel groups PG2 includes the other two pixels of the red, green, blue, and white pixels R, G, B, and W. That is, the first pixel groups PG1 display different colors from those of the second pixel groups PG2.

As shown in FIG. 3, each of the first pixel groups PG1 includes the red pixel R and green pixel G, each of the second pixel groups PG2 includes the blue pixel B and white pixel W. However, the arrangement of the pixels PX should not be limited to the arrangement shown in FIG. 3.

For instance, each of the first pixel groups PG1 may be configured to include the red and blue pixels R and B and each of the second pixel groups PG2 may be configured to include the green and white pixels G and W. In addition, each of the first pixel groups PG1 may be configured to include the red and white pixels R and W and each of the second pixel groups PG2 may be configured to include the green and blue pixels G and B.

Among the first to ninth data lines DL1 to DL9, the pixels PX arranged in a c-th column between a j-th data line and a (j+1)th data line are alternately connected to the j-th data line and the (j+1)th data line in the unit of at least one pixel. Each of "j" and "c" is a natural number. Hereinafter, the connections between the pixels PX and the first to ninth data lines DL1 to DL9 will be described in detail when each of "j" and "c" is 1.

The pixels PX arranged in a first column between the first and second data lines DL1 and DL2 are alternately connected to the first and second data lines DL1 and DL2 in the unit of one pixel. That is, the pixels PX arranged in each column are alternately connected to the data lines respectively disposed adjacent to left and right sides of each column in the unit of one pixel.

For instance, the red pixels R+ of the first pixel groups PG1 arranged in the first column are connected to the first data line DL1 and the blue pixels B− of the second pixel groups PG2 arranged in the first column are connected to the second data line DL2.

Among the pixels arranged in a (2c−1)th column, two pixels PX adjacent to each other in the second direction DR2 such that a 2i-th gate line is disposed between the two pixels PX are commonly connected to the 2i-th gate line. The "i" is a natural number. In addition, among the pixels arranged in a 2c-th column, two pixels PX adjacent to each other in the second direction DR2 such that a (2i−1)th gate line is disposed between the two pixels PX are commonly connected to the (2i−1)th gate line.

In detail, among the pixels PX arranged in the first column, the red pixel R+ and the blue pixel B−, which are adjacent to each other in the second direction DR2 such that the second gate line GL2 is disposed between the red pixel R+ and the blue pixel B−, are commonly connected to the second gate line GL2. Among the pixels PX arranged in the third column, the blue pixel B+ and the red pixel R−, which are adjacent to each other in the second direction DR2 such that the second gate line GL2 is disposed between the blue pixel B+ and the red pixel R−, are commonly connected to the second gate line GL2.

Thus, the red pixel R+ and the blue pixel B− arranged in the first column and connected to the second gate line GL2 are substantially simultaneously driven by the gate signal provided through the second gate line GL2. The blue pixel B− and the red pixel R− arranged in the third column and connected to the second gate line GL2 are substantially simultaneously driven by the gate signal provided through the second gate line GL2.

Among the pixels PX arranged in a second column, the white pixel W+ and the green pixel G−, which are adjacent to each other in the second direction DR2 such that the third gate line GL3 is disposed between the white pixel W+ and the green pixel G−, are commonly connected to the third gate line GL3. Among the pixels PX arranged in a fourth column, the green pixel G+ and the white pixel W−, which are adjacent to each other in the second direction DR2 such that the third gate line GL3 is disposed between the green pixel G+ and the white pixel W−, are commonly connected to the third gate line GL3.

Accordingly, the white pixel W+ and the green pixel G− arranged in the second column and connected to the third gate line GL3 are substantially simultaneously driven by the gate signal provided through the third gate line GL3. The green pixel G+ and the white pixel W− arranged in the fourth column and connected to the third gate line GL3 are substantially simultaneously driven by the gate signal provided through the third gate line GL3.

The connection structure between the pixels PX and the gate lines should not be limited to the above-mentioned connection structure. For instance, two pixels PX among the pixels PX arranged in the (2c−1)th column, which are adjacent to each other in the second direction DR2 such that the (2i−1)th gate line between the two pixels PX, are commonly connected to the (2i−1)th gate line. In addition, two pixels PX among the pixels PX arranged in the 2c-th column, which are adjacent to each other in the second direction DR2 such that the 2i-th gate line between the two pixels PX, are commonly connected to the 2i-th gate line.

The polarity of the data voltages applied to the first to ninth data lines DL1 to DL9 is inverted every one data line. For instance, odd-numbered data lines DL1, DL3, DL5, DL7, and DL9 are applied with the data voltages having the positive (+) polarity and even-numbered data lines DL2, DL4, DL6, and DL8 are applied with the data voltages having the negative (−) polarity as shown in FIG. 3.

FIG. 3 shows the polarity of the data voltages applied to the pixels PX of the display panel 110 during the present frame period. As described above, the data driver 140 outputs the data voltages after inverting the polarity of the data voltages every frame period. Therefore, the polarity of the data voltages applied to the pixels PX is inverted in a next frame period.

Figure 4A:
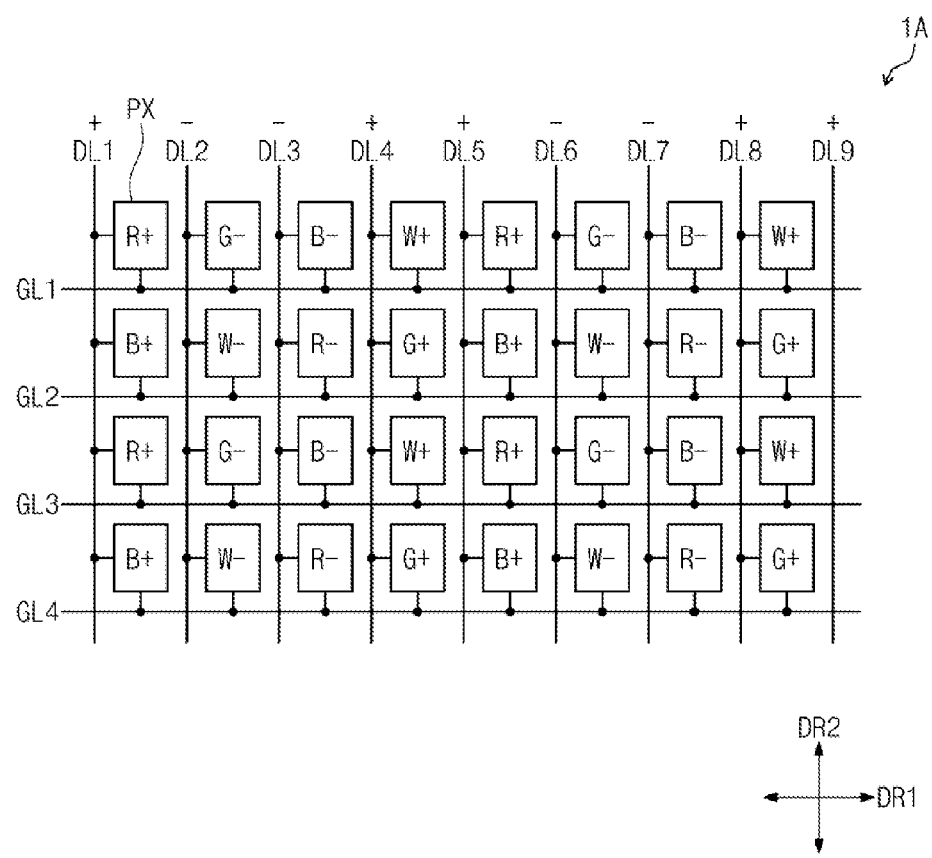
FIG. 4A is a plan view showing a part of a liquid crystal panel according to a first comparison example.
Figure 4B:
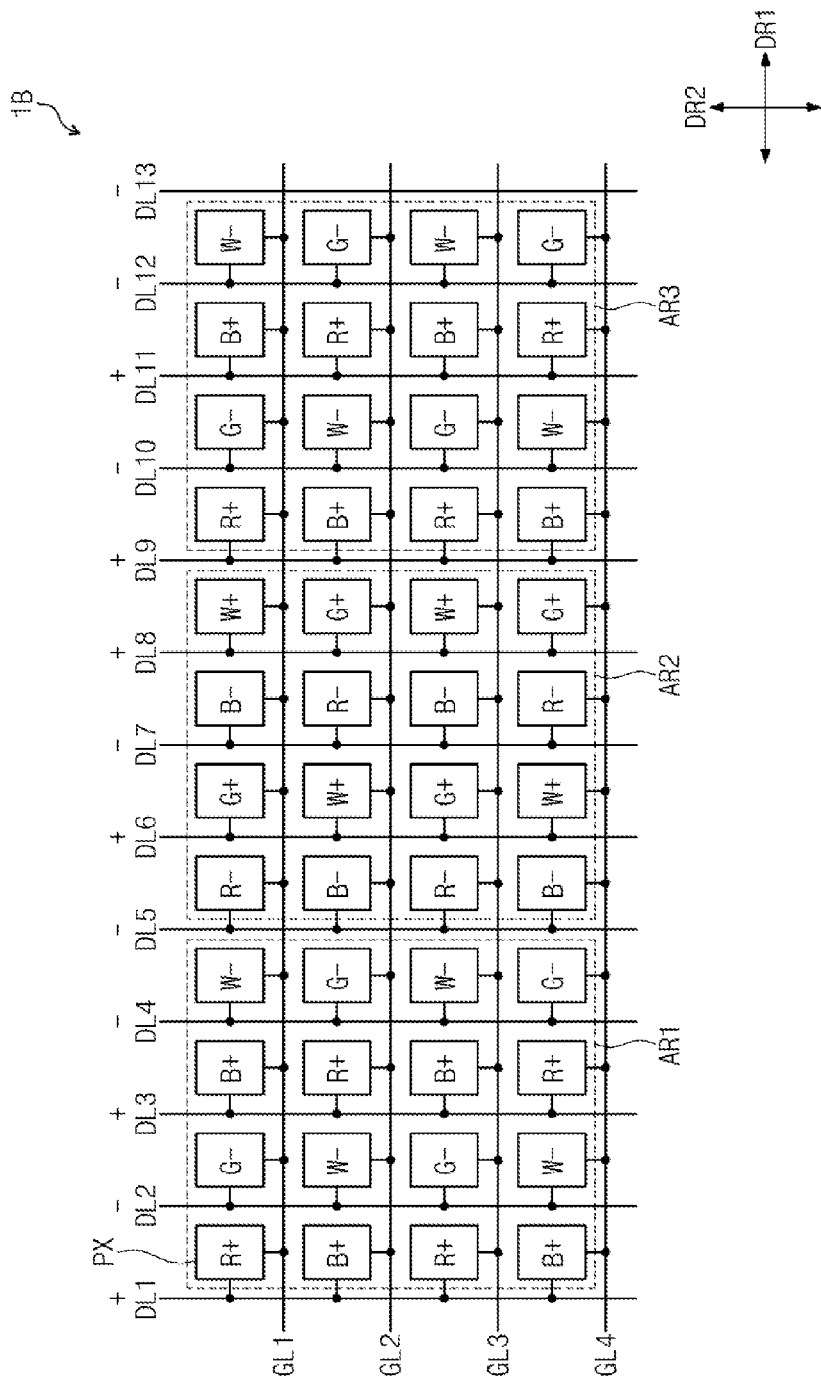
FIG. 4B is a plan view showing a part of a liquid crystal panel according to a second comparison example.

FIG. 4A is a plan view showing a part of a liquid crystal panel according to a first comparison example and FIG. 4B is a plan view showing a part of a liquid crystal panel according to a second comparison example.

Hereinafter, configuration and operation of the liquid crystal panels according to the first and second comparison examples will be described with reference to FIGS. 4A and 4B and effectiveness of the liquid crystal panel shown in FIG. 3 will be described.

Referring to FIGS. 4A and 4B, each of a first comparison liquid crystal panel 1A according to the first comparison example and a second comparison liquid crystal panel 1B according to the second comparison example includes a plurality of pixels PX.

The pixels PX arranged in odd-numbered rows are arranged in order of red, green, blue, and white pixels R, G, B, and W and the pixels PX arranged in even-numbered rows are arranged in order of the blue, white, red, and green pixels B, W, R, and G.

The pixels PX are connected to corresponding gate lines in the unit of row and connected to corresponding data lines in the unit of column. The unit of row is the pixels PX in a common row and the unit of column is the pixels PX in a common column.

The polarities of the data voltages applied to first to ninth data lines DL1 to DL9 of the first comparison liquid crystal panel 1A are repeatedly varied in order of the positive (+) polarity, the negative (−) polarity, the negative (−) polarity, and the positive (+) polarity. For instance, the polarities of the data voltages applied to the first to ninth data lines DL1 to DL9 of the first comparison liquid crystal panel 1A may be +, −, −, +, +, −, −, +, and +, respectively.

The polarities of the data voltages applied to first to thirteenth data lines DL1 to DL13 of the second comparison liquid crystal panel 1B are inverted every four data lines, and the polarities of the data voltages applied to the four data lines are inverted every one data line. For instance, the polarities of the data voltages applied to the first to thirteenth data lines DL1 to DL13 of the second comparison parison crystal panel 1B may be +, −, +, −, −, +, −, +, +, −, +, −, and −, respectively.

The polarities of the data voltages applied to the pixels PX of the first and second comparison liquid crystal panels 1A and 1B are inverted every frame period.

Hereinafter, the operation of displaying the image of red in the first and second comparison liquid crystal panels 1A and 1B will be described and the pixels displaying the same color will be referred to as the same pixels.

As shown in FIG. 4A, the same pixels connected to the same gate line are operated in response to the data voltages having the same polarity. For instance, the red pixels R+ connected to the first gate line GL1 are operated in response to the data voltages having the positive (+) polarity, and the red pixels R− connected to the second gate line GL2 are operated in response to the data voltages having the negative (−) polarity.

When the data voltages applied to the same pixels connected to the same gate line are maintained at the same polarity during 1H period (the activation period as discussed below) in which the pixels are operated in each row, a ripple, e.g., an unwanted voltage variation, occurs in the common voltage due to a coupling phenomenon between the data lines and the common electrode.

When the data voltages have the positive (+) polarity, the ripple occurs in the common voltage in a positive way, and when the data voltages have the negative (−) polarity, the ripple occurs in the common voltage in a negative way.

When the red pixel is operated to display the red color and the tipple occurs in the common voltage, a difference in brightness between an adjacent region to the red pixel R in the first direction DR1 and upper and lower regions of the red pixel R may be recognized. In addition, a difference in brightness between the adjacent region to the red pixel R and upper and lower regions of the adjacent region may be perceived. That is, a horizontal crosstalk occurs.

Since the red pixels R+ connected to the first gate line GL1 are operated in response to the data voltages having the positive (+) polarity, the ripple occurs in the common voltage in the positive way, and thus the horizontal crosstalk occurs. Since the red pixels R−connected to the second gate line GL2 are operated in response to the data voltages having the negative (−) polarity, the ripple occurs in the common voltage in the negative way, and thus the horizontal crosstalk occurs.

The second comparison liquid crystal panel 1B shown in FIG. 4B displays the red image in a first area AR1 and a second area AR2 during the present frame period and displays the red image in the second area AR2 and a third area AR3 during the next frame period.

In this case, a difference in brightness between the red pixel R+ applied with the data voltage having the positive (+) polarity and the red pixel R− applied with the data voltage having the negative (−) polarity occurs. Due the brightness difference, the image in which a vertical line moves may be recognized while the present frame period is changed to the next frame period.

Hereinafter, a phenomenon in which the vertical line moves is referred to as a moving line-stain phenomenon. The moving line-stain phenomenon may occur not only in the case that a specific color is displayed but also in the case that all the pixels are operated, e.g., a full white mode.

However, the red pixels R+ arranged in the first row and connected to the second gate line GL2 in the display panel 110 shown in FIG. 3 receive the data voltages having the positive (+) polarity and the red pixels R− arranged in the second row and connected to the second gate line GL2 receive the data voltages having the negative (−) polarity.

In this case, the sum of the data voltages having the positive (+) polarity and applied to the red pixels R+ connected to the second gate line GL2 and the sum of the data voltages having the negative (−) polarity and applied to the red pixels R− connected to the second gate line GL2 are offset against each other, and thus the ripple does not occur in the common voltage. That is, the data voltages having the positive (+) polarity and the data voltages having the negative (−) polarity, which are applied to the pixels PX connected to the same gate line during the 1H period, are offset against each other, and thus the ripple does not occur in the common voltage. As a result, the horizontal crosstalk phenomenon may be prevented from occurring.

In addition, the same pixels PX arranged in the same row of the display panel 110 shown in FIG. 3 are operated in response to the data voltages having the same polarity. For instance, the red pixels R+ arranged in the first row are operated in the data voltages having the positive (+) polarity. When the same pixels PX arranged in the same row are operated in response to the data voltages having the same polarity, the moving line-stain phenomenon may be improved.

Accordingly, the display apparatus 100 according to the present exemplary embodiment may prevent the occurrence of the horizontal crosstalk phenomenon and the moving line-stain phenomenon.

Figure 6:
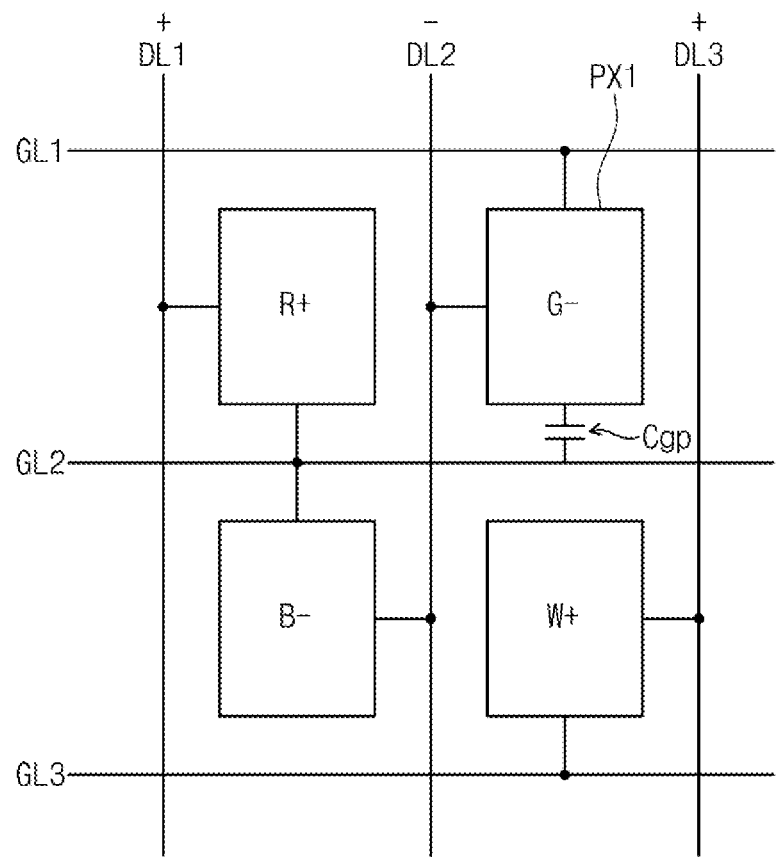
FIG. 6 is a view showing pixels connected to first to third gate lines and first to third data lines.

FIG. 5 is a timing diagram of gate signals according to an exemplary embodiment of the present disclosure and FIG. 6 is a view showing pixels connected to first to third gate lines and first to third data lines.

Referring to FIG. 5, the gate signals are not sequentially and consecutively applied to two gate lines adjacent to each other and applied to the gate lines in a predetermined order while skipping at least one gate line.

For instance, after the gate signal is applied to the first gate line GL1, a next gate signal is applied to the third gate line GL3 while skipping the second gate line GL2 without being applied to the second gate line GL2.

After the gate signal is applied to the third gate line GL3, a next gate signal is applied to the fifth gate line GL5 after skipping the fourth gate line GL4 without being applied to the second and fourth gate lines GL2, GL4, which are disposed adjacent to the third gate line GL3.

After the gate signal is applied to the fifth gate line GL5, a next gate signal is applied to the second gate line GL2 after skipping the fourth and third gate lines GL4 and GL3 without being applied to the fourth and sixth gate lines GL4 and GL6, which are disposed adjacent to the fifth gate line GL5.

The gate signals are applied to the gate lines in the same way as described above. That is, an output timing of the gate signals is set to allow the gate signals not to be sequentially and consecutively applied to the two gate lines adjacent to each other.

After the gate signal is applied to the first gate line GU, the gate signals are sequentially applied to the gate lines in the unit of 4k gate lines. In addition, the gate signals are applied to the 4k gate lines in a predetermined order while skipping at least one gate line in the 4k gate lines. In the present exemplary embodiment, the "k" is a natural number and is 1.

After the gate signal is applied to the first gate line GL1, the gate signals are applied to the second to fifth gate lines GL2 to GL5, and then next gate signals are applied to the sixth to ninth gate lines GL6 to GL9. The output timing of the gate signals is repeated until an m-th gate line is applied with the gate signal.

After the gate signal is applied to the first gate line GL1, the gate signals are applied to the four gate lines in order of the second, fourth, first, and third gate lines in the unit of four gate lines.

In detail, the gate signals are applied to the second to fifth gate lines GL2 to GL5 in order of the third gate line GL3 corresponding to the second gate line in the second to filth gate lines GL2 to GL5, the fifth gate line GL5 corresponding to the fourth gate line in the second to fifth gate lines GL2 to GL5, the second gate line GL2 corresponding to the first gate line in the second to fifth gate lines GL2 to GL5, and the fourth gate line GL1 corresponding to the third gate line in the second to fifth gate lines GL2 to GL5.

Then, the gate signals are applied to the sixth to ninth gate lines GL6 to GL9 in the same order as that of the second to fifth gate lines GL2 to GL5. The output timing of the gate signals is repeated until the m-th gate line is applied with the gate signal.

Among the gate signals, the present gate signal and the next gate signal are partially overlapped with each other. A high level period of the gate signals is referred to as an activation period (1H).

For instance, the present gate signal applied to the first gate line GL1 is partially overlapped with the next gate signal applied to the third gate line GL3. In detail, a predetermined portion 1P of an end portion of the activation period 1H of the present gate signal applied to the first gate line GL1 is overlapped with a predetermined portion of a start portion of the activation period 1H of the next gate signal applied to the third gate line GL3.

When the gate signals are sequentially applied to the first to m-th gate lines GL1 to GLm such that the gate signals are partially overlapped with each other, the display quality of the display apparatus is deteriorated. Hereinafter, the deterioration in display quality of the display apparatus will be described with reference to FIG. 6.

Referring to FIG. 6, a first pixel PX1 applied with the gate signal through the first gate line GL1 receives the data voltage through the second data line DL2. The first pixel PX1 is charged with a pixel voltage corresponding to the data voltage applied thereto.

The pixel voltage is charged in the first pixel PX1 during the activation period 1H of the gate signal. However, when the gate signals are sequentially applied to the first and second gate lines GL1 and GL2 such that the gate signals are partially overlapped with each other, the gate signal is applied to the second gate line GL2 before the activation period 1H of the gate signal applied to the first gate line GL1 is finished.

A parasitic capacitor Cgp is formed between the second gate line GL2 and the pixel electrode PE of the first pixel PX1. When the gate signal is applied to the second gate line GL2 before the first pixel PX1 is completely charged with the pixel voltage, a level of the pixel voltage charged in the first pixel PX1 is changed due to the coupling effect between the second gate line GL2 and the pixel electrode PE of the first pixel PX1.

That is, the pixel voltage is not normally charged in the first pixel PX1 during the activation period 1H of the gate signal applied to the first gate line GL1. As a result, the display quality of the display apparatus is deteriorated.

However, according to the present exemplary embodiment of the present disclosure, the gate signals are not sequentially applied to the two gate lines adjacent to each other as shown in FIG. 5. For instance, the gate signal is applied to the third gate line GL3 rather than the second gate line GL2 disposed adjacent to the first gate line GL1 while the first pixel PX1 is charged with the pixel voltage corresponding to the data voltage applied thereto in response to the gate signal provided through the first gate line GL1.

Since the gate signal is not applied to the second gate line GL2 until the pixel voltage is completely charged in the first pixel PX1 during the activation period 1H of the gate signal, the first pixel PX1 is normally charged with the pixel voltage. Accordingly, the display quality of the image displayed in the display panel 110 is improved.

Consequently, the display apparatus 100 according to the present exemplary embodiment of the present disclosure may have the improved display quality.

FIGS. 7 to 10 are timing diagrams showing gate signals according to various exemplary embodiments of the present disclosure.

Similar to the timing of the gate signals shown in FIG. 5, the gate signals shown in FIGS. 7 to 10 are applied to the gate lines while skipping at least one gate line without being sequentially and consecutively applied to the two gate lines adjacent to each other.

In addition, the timings of the gate signals shown in FIGS. 7 to 10 are set to allow the present gate signal to partially overlap with the next gate signal as the timings of the gate signals shown in FIG. 5.

Figure 7:
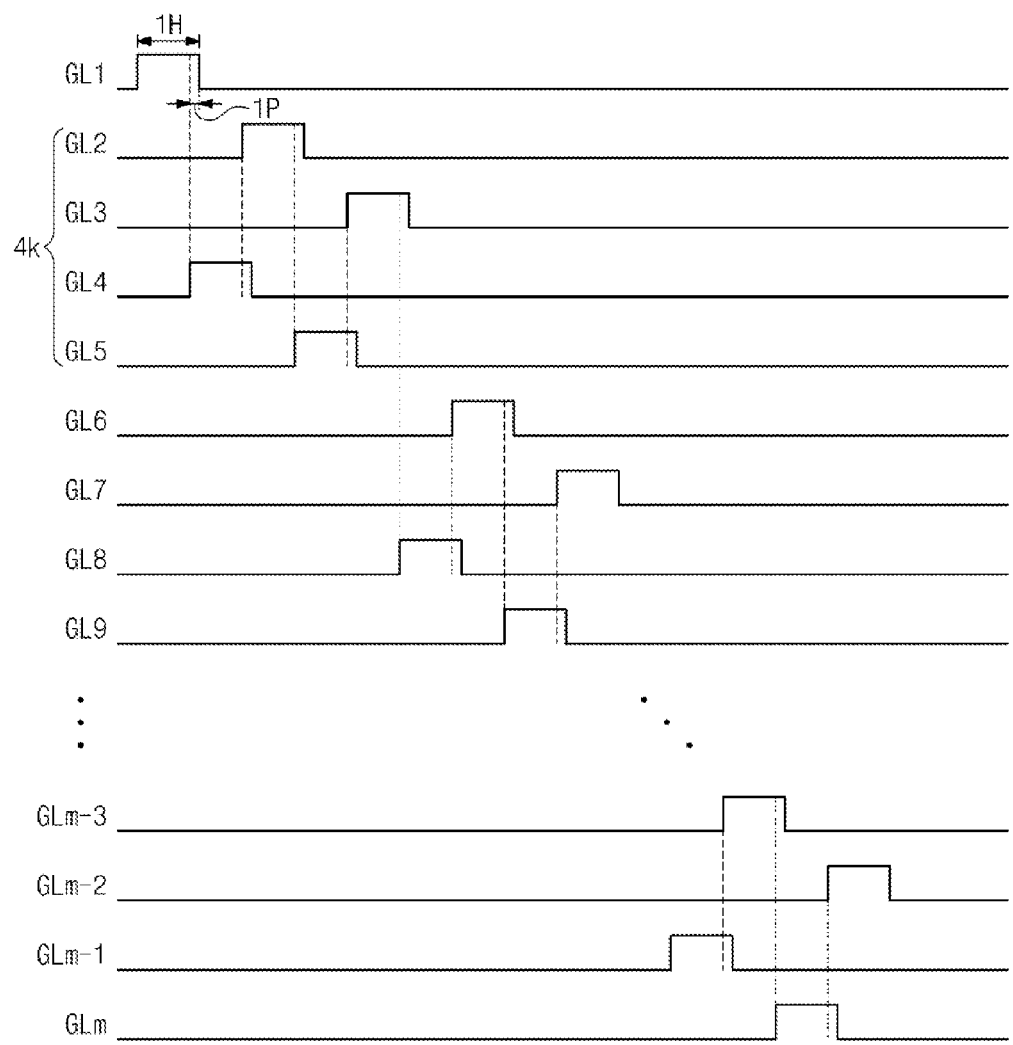
FIGS. 7, 8, 9, and 10 are timing diagrams showing gate signals according to various exemplary embodiments of the present disclosure.

Referring to FIG. 7, after the gate signal is applied to the first gate line GL1, the gate signals are sequentially applied to the gate lines in the unit of 4k gate lines. In addition, the gate signals are applied to the 4k gate lines in a predetermined order while skipping at least one gate line in the 4k gate lines.

When the "k" is 1, after the gate signal is applied to the first gate line GL1, the gate signals are applied to the four gate lines in order of the third, first, fourth, and second gate lines in the four gate lines.

In detail, the gate signals are applied to the second to fifth gate lines GL2 to GL5 in order of the fourth gate line GL4 corresponding to the third gate line in the second to fifth gate lines GL2 to GL5, the second gate line GL2 corresponding to the first gate line in the second to fifth gate lines GL2 to GL5, the fifth gate line GL5 corresponding to the fourth gate line in the second to filth gate lines GL2 to GL5, and the third gate line GL3 corresponding to the second gate line in the second to fifth gate lines GL2 to GL5. The output timings of the gate signals are repeated until the m-th gate line is applied with the gate signal.

Figure 8:
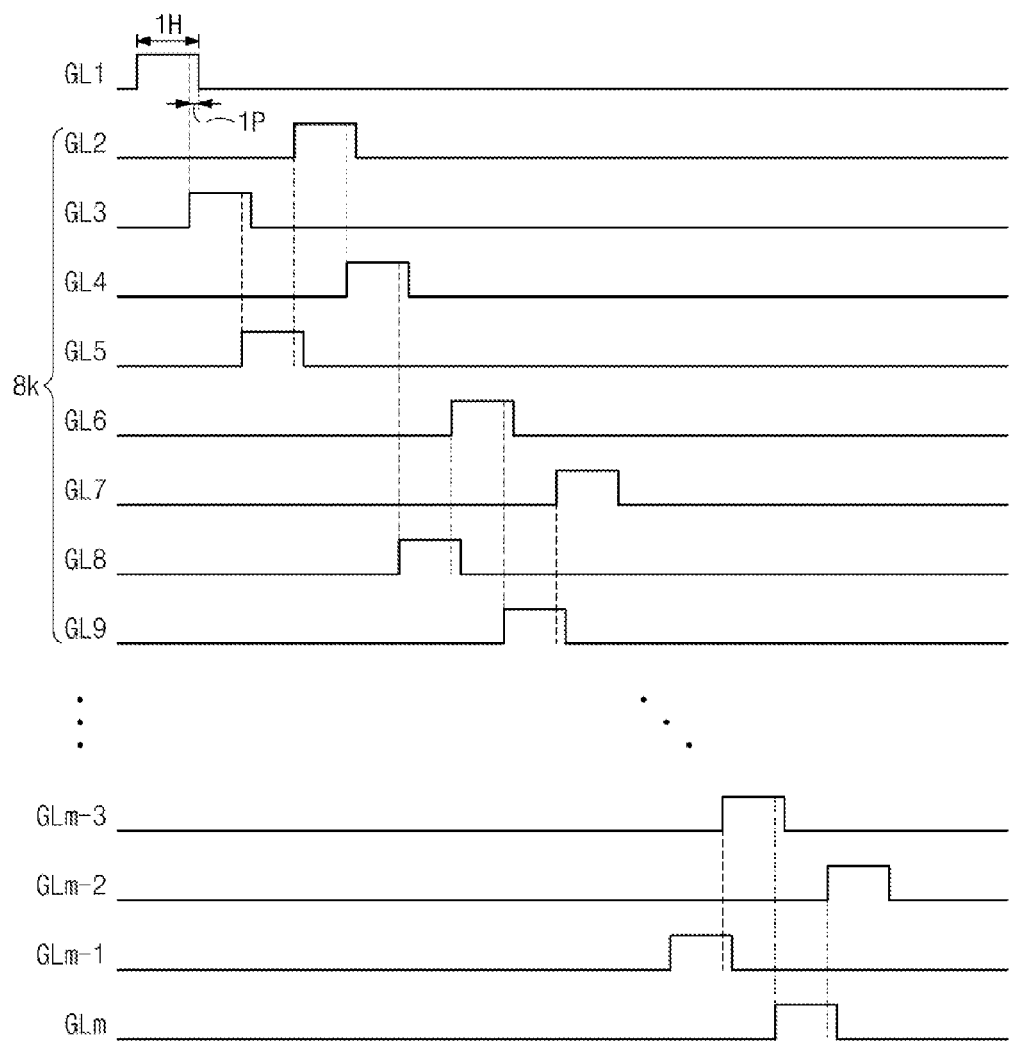

Referring to FIG. 8, after the gate signal is applied to the first gate line GL1, the gate signals are sequentially applied to the gate lines in the unit of 8k gate lines.

After the gate signal is applied to the first gate line GL1, the gate signals are applied to the second to ninth gate lines GL2 to GL9, and then next gate signals are applied to the tenth to seventeenth gate lines (not shown). The output timings of the gate signals are repeated until the m-th gate line is applied with the gate signal.

In addition, the gate signals are applied to the 8k gate lines in a predetermined order while skipping at least one gate line in the 8k gate lines.

When the "k" is 1, after the gate signal is applied to the first gate line GL1, the gate signals are applied to the eight gate lines in order of the second, fourth, first, third, seventh, fifth, eighth, and sixth gate lines in the eight gate lines.

In detail, the gate signals are applied to the second to ninth gate lines GL2 to GL9 in order of the third gate line GL3 corresponding to the second gate line in the second to ninth gate lines GL2 to GL9, the fifth gate line GL5 corresponding to the fourth gate line in the second to ninth gate lines GL2 to GL9, the second gate line GL2 corresponding to the first gate line in the second to ninth gate lines GL2 to GL9, the fourth gate line GL4 corresponding to the third gate line in the second to ninth gate lines GL2 to GL9, the eighth gate line GL5 corresponding to the seventh gate line in the second to ninth gate lines GL2 to GL9, the sixth gate line GL6 corresponding to the fifth gate line in the second to ninth gate lines GL2 to GL9, the ninth gate line GL9 corresponding to the eighth gate line in the second to ninth gate lines GL2 to GL9, and the seventh gate line GL7 corresponding to the sixth gate line in the second to ninth gate lines GL2 to GL9. The output timings of the gate signals are repeated until the m-th gate line is applied with the gate signal.

Figure 9:
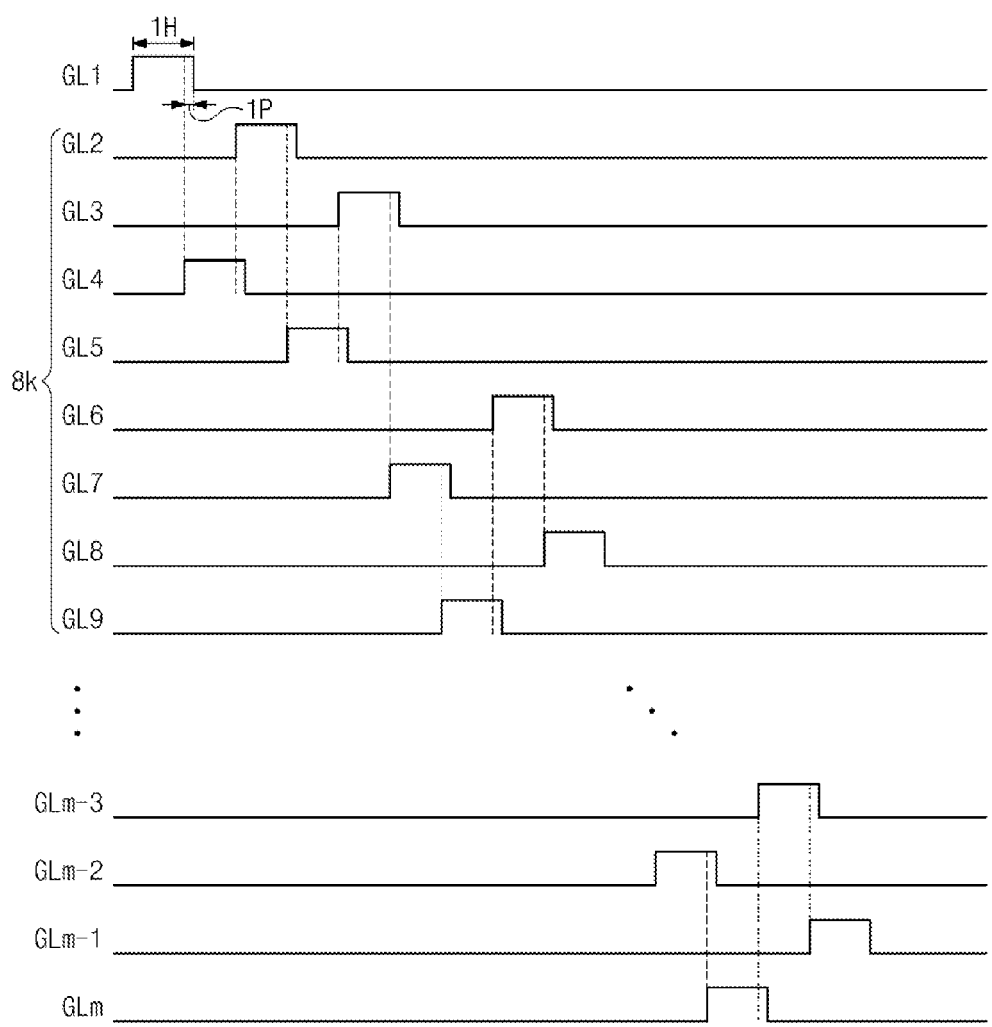

Referring to FIG. 9, after the gate signal is applied to the first gate line GL1, the gate signals are sequentially applied to the gate lines in the unit of 8k gate lines. In addition, the gate signals are applied to the 8k gate lines in a predetermined order while skipping at least one gate line in the 8k gate lines.

When the "k" is 1, after the gate signal is applied to the first gate line GL1, the gate signals are applied to the eight gate lines in order of the third, first, fourth, second, sixth, eighth, fifth, and seventh gate lines in the eight gate lines.

In detail, the gate signals are applied to the second to ninth gate lines GL2 to GL9 in order of the fourth gate line GL4 corresponding to the third gate line in the second to ninth gate lines GL2 to GL9, the second gate line GL2 corresponding to the first gate line in the second to ninth gate lines GL2 to GL9, the fifth gate line GL5 corresponding to the fourth gate line in the second to ninth gate lines GL2 to GL9, the third gate line GL3 corresponding to the second gate line in the second to ninth gate lines GL2 to GL9, the seventh gate line GL7 corresponding to the sixth gate line in the second to ninth gate lines GL2 to GL9, the ninth gate line GL9 corresponding to the eighth gate line in the second to ninth gate lines GL2 to GL9, the sixth gate line GL6 corresponding to the fifth gate line in the second to ninth gate lines GL2 to GL9, and the eighth gate line GL1 corresponding to the seventh gate line in the second to ninth gate lines GL2 to GL9. The output timings of the gate signals are repeated until the m-th gate line is applied with the gate signal.

Figure 10:
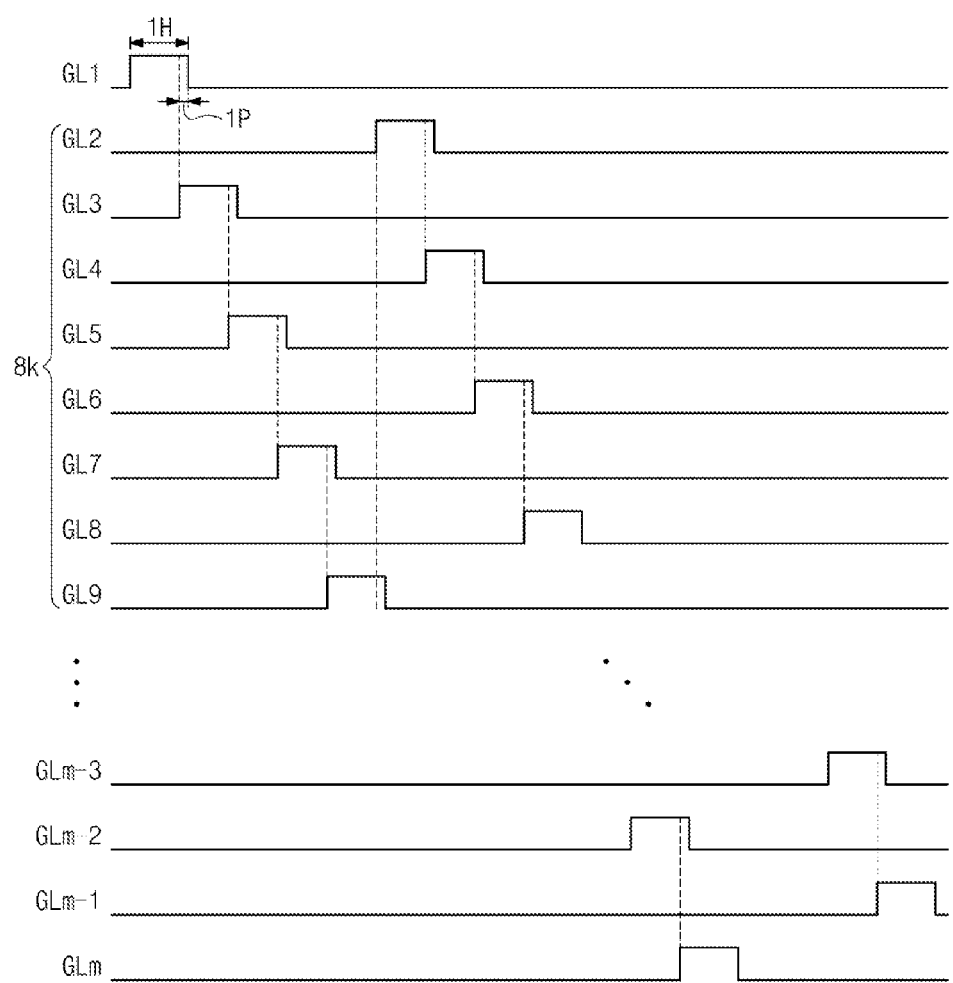

Referring to FIG. 10, after the gate signal is applied to the first gate line GL1, the gate signals are sequentially applied to the gate lines in the unit of 8k gate lines. In addition, the gate signals are applied to the 8k gate lines in a predetermined order while skipping at least one gate line in the 8k gate lines.

When the "k" is 1, after the gate signal is applied to the first gate line GL1, the gate signals are applied to the eight gate lines in order of the second, fourth, sixth, eighth, first, third, fifth, and seventh gate lines in the eight gate lines.

In detail, the gate signals are applied to the second to ninth gate lines GL2 to GL9 in order of the third gate line GL3 corresponding to the second gate line in the second to ninth gate lines GL2 to GL9, the fifth gate line GL5 corresponding to the fourth gate line in the second to ninth gate lines GL2 to GL9, the seventh gate line GL7 corresponding to the sixth gate line in the second to ninth gate lines GL2 to GL9, the ninth gate line GL9 corresponding to the eighth gate line in the second to ninth gate lines GL2 to GL9, the second gate line GL2 corresponding to the first gate line in the second to ninth gate lines GL2 to GL9, the fourth gate line GL4 corresponding to the third gate line in the second to ninth gate lines GL2 to GL9, the sixth gate line GL6 corresponding to the fifth gate line in the second to ninth gate lines. GL2 to GL9, and the eighth gate line GL8 corresponding to the seventh gate line in the second to ninth gate lines GL2 to GL9. The output timings of the gate signals are repeated until the m-th gate line is applied with the gate signal.

As described above, the gate signals shown in FIGS. 7 to 10 are not sequentially applied to the two gate lines adjacent to each other. Therefore, the display quality of the display apparatus 100 according to the present disclosure is improved.

The timings of the gate signals should not be limited to those shown in FIGS. 5 and 7 to 10 as long as the gate signals are not sequentially applied to the gate lines adjacent to each other.

Although the exemplary embodiments have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A display apparatus comprising:
   a plurality of gate lines configured to receive gate signals;
   a plurality of data lines arranged to cross the gate lines and configured to receive data voltages; and
   a plurality of pixels grouped into a plurality of first pixel groups and a plurality of second pixel groups and connected to the gate lines and the data lines, wherein a k-th gate signal of the gate signals is applied to an i-th gate line of the gate lines, a (k+1)-th gate signal of the gate signals is applied to an (i+h)-th gate line of the gate lines, a g-th gate signal of the gate signals is applied to a j-th gate line of the gate lines, a (g+1)-th gate signal of the gate signals is applied to a (j-h)-th gate line of the gate lines, the k and i are each natural numbers, the h and g are each natural numbers greater than or equal to 2, the k is a natural number different from the g, and the j is a natural number greater than the h.

2. The display apparatus of claim 1, wherein the pixels arranged in a c-th column between a j-th data line and a (j+1)th data line among the data lines are alternately connected to the j-th data line and the (j+1)th data line, and each of j and c is a natural number.

3. The display apparatus of claim 2, wherein, among the pixels arranged in a (2c−1)th column, two pixels adjacent to each other in a column direction such that a 2i-th gate line is disposed between the two pixels are commonly connected to the 2i-th gate line, among the pixels arranged in a 2c-th column, two pixels adjacent to each other in the column direction such that a (2i−1)th gate line is disposed between the two pixels are commonly connected to the (2i−1)th gate line, and the i is a natural number.

4. The display apparatus of claim 1, wherein each of the pixels is configured to display one color of red, green, blue, white, yellow, cyan, and magenta colors.

5. The display apparatus of claim 1, wherein the first pixel groups are alternately arranged with the second pixel groups in row and column directions and are configured to display colors different from colors configured to be displayed by the second pixel groups.

6. The display apparatus of claim 1, wherein each of the first and second pixel groups comprises 2h pixels and the h is a natural number.

7. The display apparatus of claim 6, wherein each of the first pixel groups comprises two pixels of red, green, blue, and white pixels and each of the second pixel groups comprises the other two pixels of the red, green, blue, and white pixels.

8. The display apparatus of claim 7, wherein each of the first pixel groups comprises the red pixel configured to display a red color and the green pixel configured to display a green color.

9. The display apparatus of claim 7, wherein each of the second pixel groups comprises the blue pixel configured to display a blue color and the white pixel configured to display a white color.

10. The display apparatus of claim 1, wherein a polarity of the data voltages configured to be applied to the data lines is inverted every one data line and inverted every frame period.

11. The display apparatus of claim 1, wherein the gate signals are configured to be sequentially applied to the gate lines in the unit of 4k gate lines after a first gate line of the gate lines is applied with a corresponding gate signal of the gate signals, and the k is a natural number.

12. The display apparatus of claim 11, wherein the gate signals are configured to be applied to the 4k gate lines in a predetermined order while skipping at least one gate line in the 4k gate lines.

13. The display apparatus of claim 12, wherein the gate signals are configured to be applied to the four gate lines in order of second, fourth, first, and third gate lines of the four gate lines after the corresponding gate signal is applied to the first gate line.

14. The display apparatus of claim 12, wherein a predetermined portion of an end portion of an activation period of a present gate signal is overlapped with a predetermined portion of a start portion of an activation period of a next gate signal following the present gate signal.

15. The display apparatus of claim 12, wherein the gate signals are configured to be applied to the four gate lines in order of third, first, fourth, and second gate lines of the four gate lines after the corresponding gate signal is applied to the first gate line.

16. The display apparatus of claim 1, wherein the gate signals are configured to be sequentially applied to the gate lines in the unit of 8k gate lines after a first gate line of the gate lines is applied with a corresponding gate signal of the gate signals, and the k is a natural number.

17. The display apparatus of claim 16, wherein the gate signals are configured to be applied to the 8k gate lines in a predetermined order while skipping at least one gate line in the 8k gate lines.

18. The display apparatus of claim 17, wherein the gate signals are configured to be applied to the eight gate lines in order of second, fourth, first, third, seventh, fifth, eighth, and sixth gate lines of the eight gate lines after the corresponding gate signal is applied to the first gate line.

19. The display apparatus of claim 17, wherein the gate signals are configured to be applied to the eight gate lines in order of third, first, fourth, second, sixth, eighth, fifth, and seventh gate lines of the eight gate lines after the corresponding gate signal is applied to the first gate line.

20. The display apparatus of claim 17, wherein the gate signals are configured to be applied to the eight gate lines in order of second, fourth, sixth, eighth, first, third, fifth, and seventh gate lines of the eight gate lines after the corresponding gate signal is applied to the first gate line.

* * * * *